US011502520B2

(12) United States Patent
Azizan et al.

(10) Patent No.: US 11,502,520 B2
(45) Date of Patent: Nov. 15, 2022

(54) BATTERY PROTECTION CIRCUIT WITH ISOLATION DEVICE FAILURE DETECTION

(71) Applicant: MOTOROLA SOLUTIONS, INC., Chicago, IL (US)

(72) Inventors: Muhamad Ridzuan Azizan, Kedah (MY); Abdul Rashid Abdul Halim, Perlis (MY); Friedrich Bollmann, Birkenwerder (DE); Kow Chee Chong, Penang (MY); Jeevan Kanesalingam, Negeri Sembilan (MY); Macwien Krishnamurthi, Selangor (MY); Chen Kok Yeoh, Penang (MY)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 347 days.

(21) Appl. No.: 16/799,422

(22) Filed: Feb. 24, 2020

(65) Prior Publication Data

US 2021/0265847 A1    Aug. 26, 2021

(51) Int. Cl.
| | |
|---|---|
| H02J 7/00 | (2006.01) |
| G01R 1/20 | (2006.01) |
| G01R 19/00 | (2006.01) |
| H01M 10/44 | (2006.01) |

(52) U.S. Cl.
CPC ............ *H02J 7/0029* (2013.01); *G01R 1/203* (2013.01); *G01R 19/0092* (2013.01); *H01M 10/44* (2013.01); *H02J 7/00041* (2020.01)

(58) Field of Classification Search
CPC .................................................. H02J 7/0029
USPC .......................................................... 320/134
See application file for complete search history.

(56) References Cited

U.S. PATENT DOCUMENTS

| | | | |
|---|---|---|---|
| 5,963,019 A | 10/1999 | Cheon | |
| 6,879,133 B1 | 4/2005 | Geren | |
| 6,927,555 B2 | 8/2005 | Johnson | |
| 7,068,012 B1 * | 6/2006 | Geren | ................ H01M 50/581 320/136 |
| 7,808,205 B2 | 10/2010 | Rao et al. | |
| 8,072,241 B2 | 12/2011 | Kouno | |
| 8,143,858 B2 | 3/2012 | Tsugawa et al. | |
| 8,749,222 B2 | 6/2014 | Williams | |
| 8,909,173 B2 | 12/2014 | Harmke | |
| 10,103,556 B2 | 10/2018 | Snyder et al. | |
| 10,177,560 B2 | 1/2019 | Yamamoto et al. | |
| 10,193,361 B2 | 1/2019 | Arendell et al. | |

(Continued)

FOREIGN PATENT DOCUMENTS

EP        1503490 B1    10/2006

*Primary Examiner* — Jerry D Robbins
(74) *Attorney, Agent, or Firm* — Michael Best & Friedrich LLP

(57) ABSTRACT

A battery module includes a first load terminal, a second load terminal, a first charger terminal, a charger enable terminal, and a battery having a first battery terminal coupled to the first load terminal and a second terminal coupled to the second load terminal. A first isolation device is coupled between the first load terminal and the first charger terminal and has an enable terminal coupled to the charger enable terminal. A first protection circuit includes a second isolation device coupled between the second battery terminal and the second load terminal and a first sensing circuit configured to enable the second isolation device responsive to detecting a failure of the first isolation device.

18 Claims, 5 Drawing Sheets

(56) References Cited

U.S. PATENT DOCUMENTS

| | | |
|---|---|---|
| 10,461,527 B2 | 10/2019 | Arendell |
| 10,978,891 B2 | 4/2021 | Snyder et al. |
| 11,190,029 B2 | 11/2021 | Niki |
| 2002/0079865 A1 | 6/2002 | Thomas et al. |
| 2006/0091858 A1* | 5/2006 | Johnson .................... H02J 7/00 320/128 |
| 2009/0111005 A1 | 4/2009 | Hur |
| 2010/0117602 A1 | 5/2010 | Matsui et al. |
| 2011/0045323 A1* | 2/2011 | Ooi ..................... H01M 10/425 429/61 |
| 2012/0052337 A1 | 3/2012 | Krishnamurthi et al. |
| 2012/0224289 A1 | 9/2012 | Peterson et al. |
| 2013/0229145 A1 | 9/2013 | Alessandro et al. |
| 2014/0117784 A1 | 5/2014 | Weissinger, Jr. et al. |
| 2016/0049815 A1 | 2/2016 | Wu et al. |
| 2016/0126764 A1 | 5/2016 | Lim et al. |
| 2016/0276848 A1 | 9/2016 | Maltsev et al. |
| 2017/0141592 A1* | 5/2017 | Snyder .................. H02J 7/0031 |
| 2018/0191177 A1* | 7/2018 | Sundaraaman ....... H02J 7/0047 |
| 2018/0309284 A1 | 10/2018 | Arendell |
| 2019/0135127 A1 | 5/2019 | Ooi et al. |
| 2019/0363552 A1 | 11/2019 | Choi |
| 2020/0203965 A1 | 6/2020 | Abdullah et al. |
| 2020/0366282 A1 | 11/2020 | Morioka |
| 2020/0412159 A1 | 12/2020 | Snyder et al. |
| 2021/0265846 A1 | 8/2021 | Krishnamurthi et al. |
| 2021/0351586 A1 | 11/2021 | Azizan et al. |
| 2021/0351600 A1 | 11/2021 | Azizan et al. |

* cited by examiner

BATTERY PROTECTION CIRCUIT WITH ISOLATION DEVICE FAILURE DETECTION

BACKGROUND OF THE INVENTION

Portable electronic devices, for example cellular smartphones, two-way radios, etc., derive their portability from rechargeable batteries or battery modules. Rechargeable battery modules often include circuit boards, electronic circuitry, mechanical assemblies, and electromechanical protection components. The circuits employed in rechargeable battery modules include charging circuits that control current, fuel gauging circuits, temperature measurement circuits, indicator circuits, and the like.

Rechargeable battery performance, especially with respect to those having cells constructed of lithium-based materials, may be compromised if the cell within the battery pack is over or under charged. Standards boards also enact protection requirements for battery modules used in volatile environments, for example, where combustible gasses may be present in the atmosphere. For battery modules with exposed contacts that remain energized, current limits are established for situations where the contacts may become short circuited, for example, from dust or other materials in the environment. For these reasons, battery modules typically include active protection circuits. Active protection circuits operate based on current or voltage limits and open switches within the battery module if a limit is violated, thereby turning off the battery module.

The protection circuits add cost and complexity to the battery modules. Integrated circuit devices are provided for sensing the voltage and current parameters of the battery module and isolation devices are provided to isolate the contacts of the battery module when a limit is violated. Safety standards often require redundant circuitry, which increases the number of components in a device. The physical size of the protection circuits limits the ability of manufacturers to fabricate smaller and more efficient battery modules.

In general, the capacity of a battery module decreases over time due to repeated charge/discharge cycles. Battery modules with active protection circuits discharge at a quicker rate compared to battery modules without protection or with passive protection circuits, since the active protection circuits provide a constant drain on the battery cells, even when a load is not connected or operating. When a battery is discharged beyond a certain minimum charge level, the battery cells may become damaged and unable to charge. In instances where a battery module is stored for an extended period, for example, more than three months, the battery module may become depleted and damaged due to the drain from the active protection circuits.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1C:
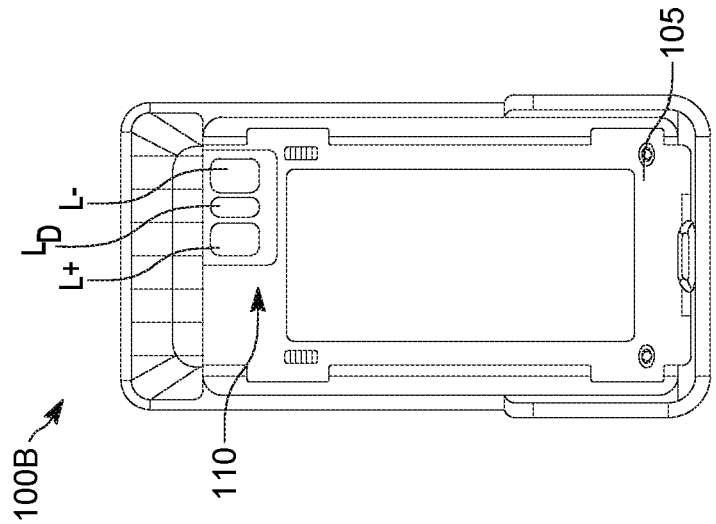
FIGS. 1A-1C are diagrams illustrating battery modules with exposed contacts, according to some embodiments.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

Protection circuits for battery modules drain the battery, even when the battery module is not used to power a load, and also add cost and complexity to the battery modules. Accordingly, embodiments disclosed herein provide, among other things, a system and method for providing battery protection.

One embodiment provides a battery module including a first load terminal, a second load terminal, a first charger terminal, a charger enable terminal, and a battery having a first battery terminal coupled to the first load terminal and a second battery terminal coupled to the second load terminal. A first isolation device is coupled between the first load terminal and the first charger terminal. The first isolation device has an enable terminal coupled to the charger enable terminal. A first protection circuit includes a second isolation device coupled between the second battery terminal and the second load terminal. The first protection circuit further includes a first sensing circuit configured to enable the second isolation device responsive to detecting a failure of the first isolation device. The battery module provides protection with reduced protection circuit footprint, component count, and cost.

Another embodiment provides a method for protecting a battery module. The method includes controlling a first isolation device to isolate a first charger terminal of the battery module from a first load terminal of the battery module responsive to a charger enable signal at a charger enable terminal of the battery module indicating an absence of a charger coupled to the first charger terminal. The first load terminal is coupled to a first battery terminal of a battery in the battery module. A first current flowing between the first load terminal and the first charger terminal is detected while the first isolation device is controlled to isolate the first charger terminal from the first load terminal. A second isolation device is controlled to isolate a second battery terminal of the battery from a second load terminal of the battery module responsive to detecting the first current, the first current indicating a failure of the first isolation device.

Figure 1B:
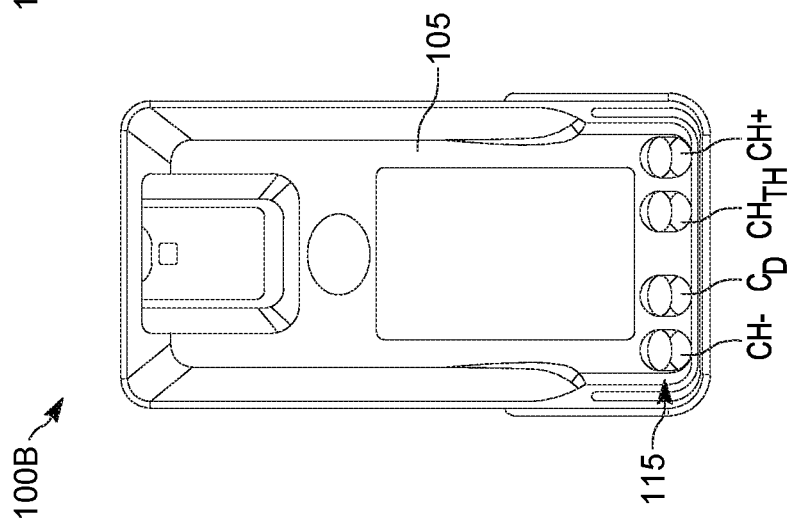
Figure 1A:
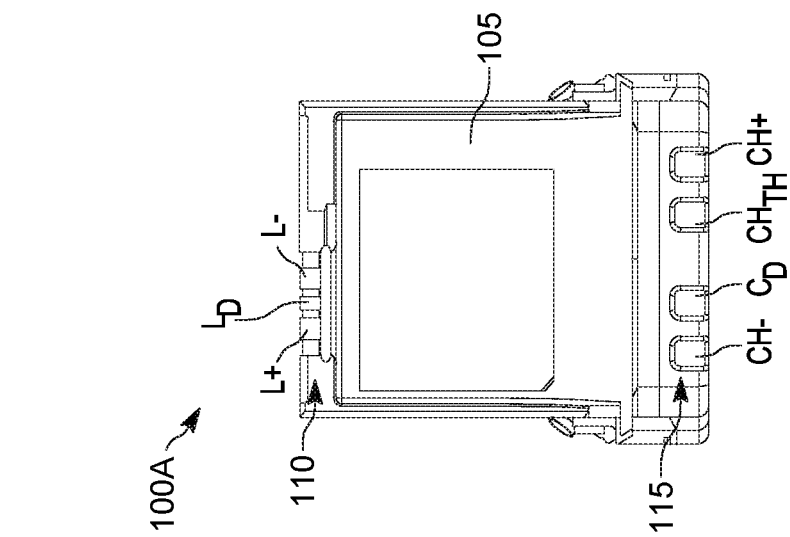

FIG. 1A is a diagram of a battery module 100A. The battery module 100A includes a housing 105 and exposed contacts, for example, load contacts 110 and charger contacts 115. The load contacts 110 include a load positive terminal L+, a load negative terminal L−, and a load data terminal LD. The charger contacts include a charger positive terminal CH+, a charger data terminal, $C_D$, a charger negative terminal CH−, and a thermistor terminal $CH_{TH}$. In the battery module 100, the load contacts 110 and the charger contacts 115 are positioned on opposite ends of the housing 105 on the same side.

FIGS. 1B and 1C are diagrams of an alternative battery module 100B. In the battery module 100B, the load contacts 110 are positioned on one side of the housing as shown in FIG. 1B and the charger contacts 115 are positioned on the opposite side and the opposite end of the housing 105 as shown in FIG. 1C.

In some embodiments, the battery modules 100A, 100B are suitable for powering a radio, for example, a radio used by emergency responders. The radio may be employed in hazardous environments.

Figure 2A:
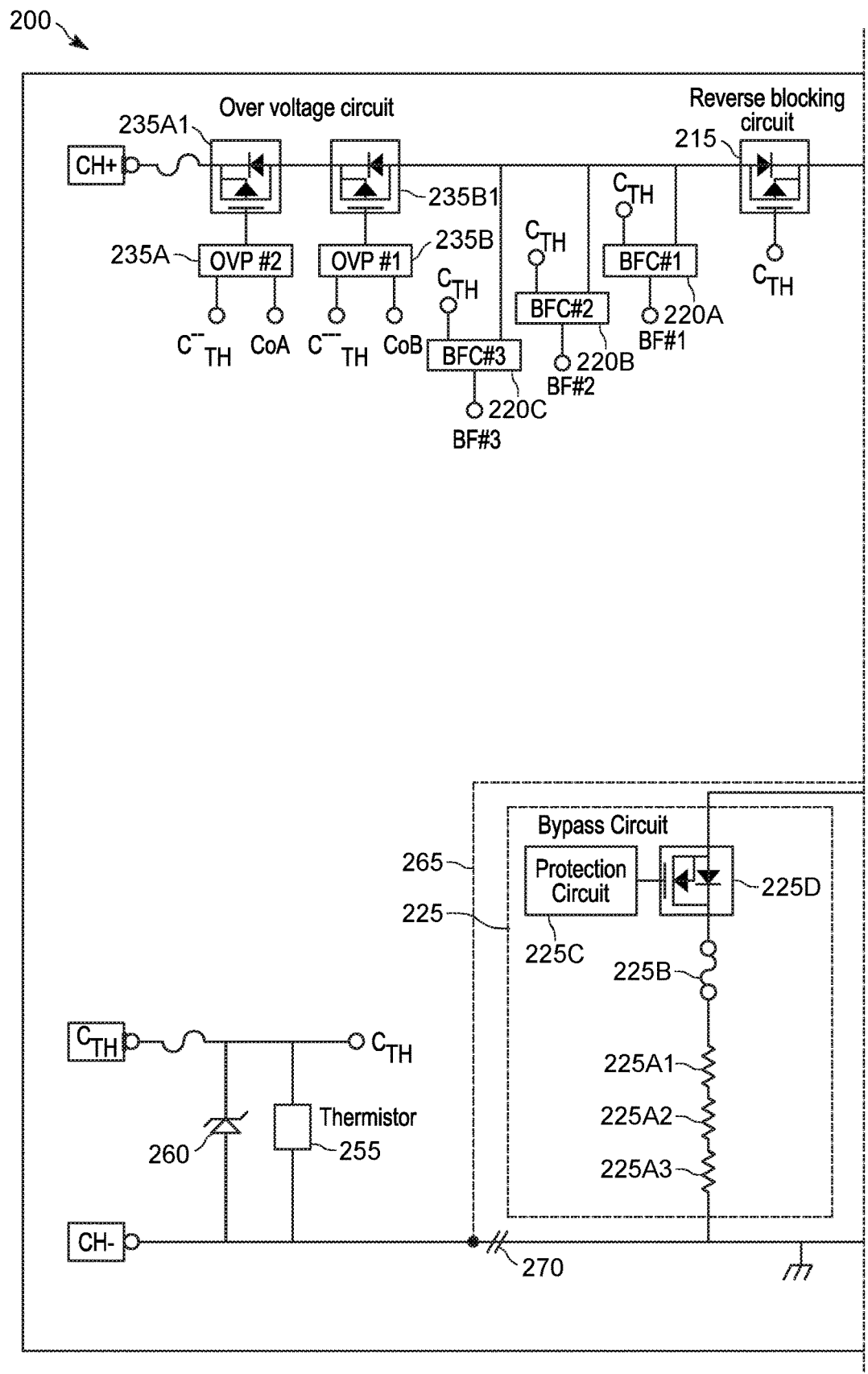
FIGS. 2A and 2B illustrate a simplified circuit diagram of a battery protection circuit, according to some embodiments.
Figure 2B:
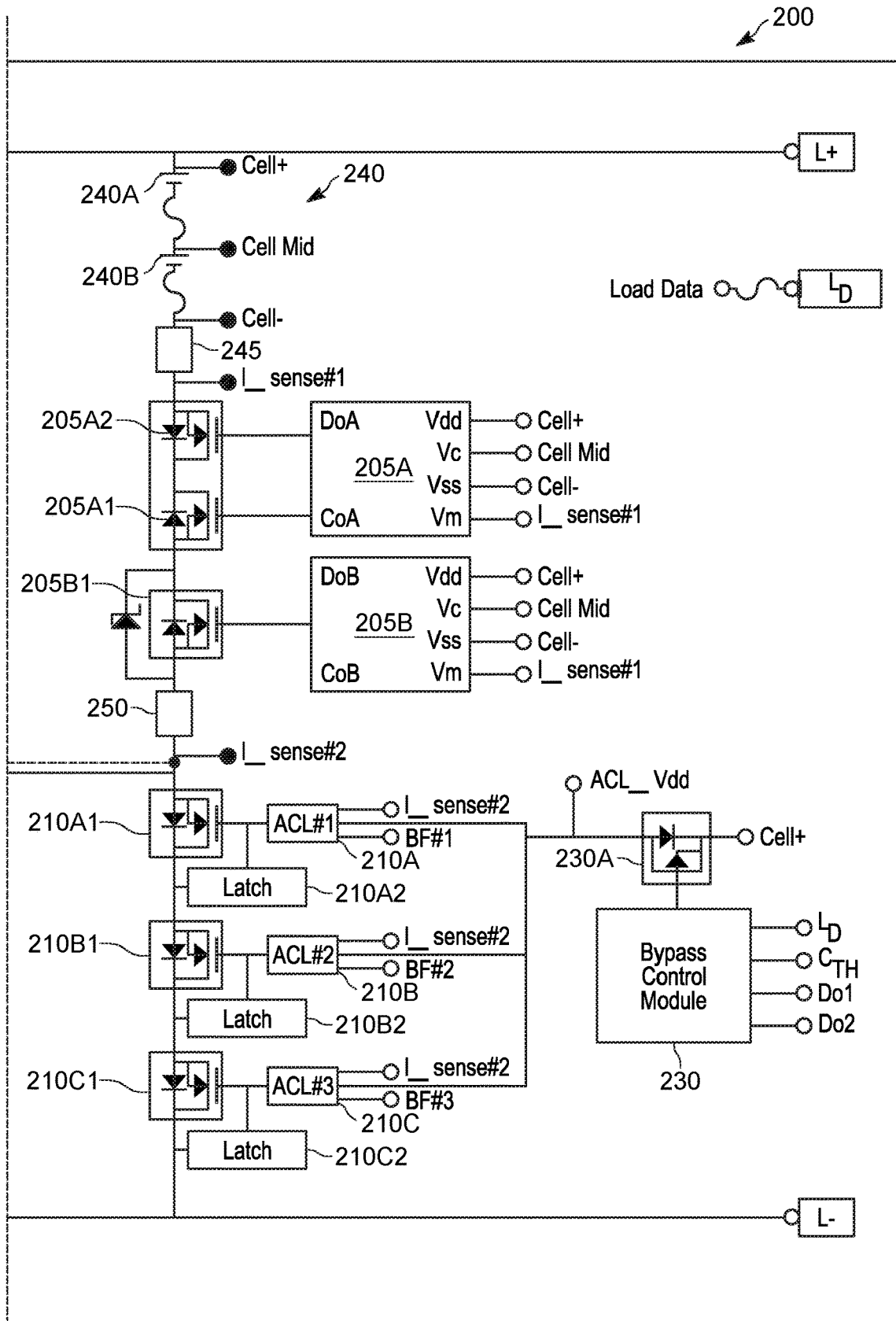

FIGS. 2A and 2B show a simplified circuit diagram of a battery protection circuit 200, according to some embodiments. Terminals L+, L−, $L_D$, CH+, CH−, and $CH_{TH}$ correspond to exposed contacts 110, 115 of the battery module 100A, 100B. The battery protection circuit 200 includes redundant protection units 205A, 205B with associated isolation devices 205A1, 205A2, 205B1, redundant active current limit (ACL) devices 210A, 210B, 210C with associated isolation devices 210A1, 210B1, 210C1 and latches 210A2, 210B2, 210C2, a reverse blocking device 215, redundant blocking failure circuits (BFC) 220A, 220B, and 220C, a bypass circuit 225, a bypass control module 230, and overvoltage protectors 235A, 235B and associated isolation devices 235A1, 235B1, for providing protection for a battery 240. In some embodiments, the battery 240 includes two cells 240A, 240B. However, the number of cells may vary. In the example shown, a first current sense resistor 245 is coupled to a negative battery terminal Cell−, and a second current sense resistor 250 is coupled between the isolation device 205B1 and the isolation device 210A1 for sensing current flowing through the battery 240. A thermistor 255 in parallel with a diode 260 is coupled across the $C_{TH}$ and CH− terminal. In instances where the battery module 100A, 100B is employed to power a radio, the L+, L−, $L_D$ terminals may be radio terminals, and a signal asserted on the LD terminal is indicative of whether the radio is active or inactive.

The particular device used to implement the protection units 205A, 205B may vary. In general, each protection unit 205A, 205B independently monitors cell voltage and current and controls the charging and discharging of the cells 240A, 240B of the battery 240. The isolation devices 205A1, 205A2 are controlled by a discharge enable terminal (DoA) and a charge enable terminal (CoA) of the protection unit 205A, respectively. The isolation device 205B1 is controlled by a charge enable terminal (CoB) of the protection unit 205B.

Each protection unit 205A, 205B includes an overcharge detector that monitors the voltages across the corresponding cells 240A, 240B (Cell+, Cell Mid, Cell−) by comparing these voltages to predetermined voltage thresholds. When the cell voltage exceeds a charge threshold, the protection unit 205A, 205B asserts the associated CoA, CoB terminal to open the associated isolation device 205A1, 205B1 and prevent any further charging of the cells 240A, 240B. Each protection unit 205A, 205B also includes an overdischarge detector that ensures that the voltage across the cells 240A, 240B does not fall below a predetermined threshold. If the voltage falls below a discharge threshold, the protection unit 205A asserts the DoA terminal to open the isolation device 205A2 and prevent any further discharge of the cells 240A, 240B. Each protection unit 205A, 205B further includes an overcurrent detector that senses the voltage drop on the current sensor resistor 245 to determine the battery current. If the battery current exceeds a current threshold, the protection unit 205A asserts the DoA terminal to open the isolation device 205A2 and interrupt the battery current. Note that the DoB terminal of the protection unit 205B does not have an associated isolation device. As described in greater detail below, the ACL devices 210A, 210B, 210C also provide overcurrent protection. Since the ACL devices 210A, 210B, 210C provide the required level of redundancy, the isolation device associated with the DoB terminal of the protection unit 205B may be omitted, reducing the cost and footprint of the battery protection circuit 200.

The ACL devices 210A, 210B, 210C measure the battery current based on the voltage present on the current sense resistor 250 and control the isolation devices 210A1, 210B1, 210C1 to interrupt the current flowing through the battery 240 if a limit is violated. If an ACL device 210A, 210B, 210C detects an overcurrent situation, it sets the associated latch 210A2, 210B2, 210C2 to maintain the lockout condition until a reset occurs. When the current flowing through the current sense resistor 250 exceeds a predetermined threshold, for example, 1.9 A, the ACL devices 210A, 210B, 210C actuate, causing the isolation devices 210A1, 210B1, 210C1 to enter a high impedance state and activating the latches 210A2, 210B2, 210C2.

In some embodiments, the $C_{TH}$ terminal is used to detect the presence of a charger coupled to the battery module 100A, 100B. When a charger is coupled to the battery module 100A, 100B, the charger reads the temperature of the battery pack by asserting a signal at the $C_{TH}$ terminal. The signal at the $C_{TH}$ terminal causes a voltage to appear across the thermistor 255. Hence the $C_{TH}$ signal indicates the presence of a charger. The $C_{TH}$ signal is provided to an enable terminal of the reverse blocking device 215 such that the reverse blocking device 215 is maintained in an open state if a charger is not present to preventing discharge of the battery 240 through the charger terminals, CH+, CH−. As a result, the charger terminals CH+, CH− are coupled to the cells 240A, 240B only when the battery module 100A, 100B is coupled to a charger, providing the advantage of protecting the battery module 100A, 100B from short circuits transients on the charger terminals CH+, CH−.

The BFCs 220A, 220B, 220C detect a failure of the reverse blocking device 215 to block discharging of the battery 240 through the charger terminals CH+, CH−. In some embodiments, the BFCs 220A, 220B, 220C detect current flowing through the reverse blocking device 215 toward the charger terminal CH+ when the $C_{TH}$ terminal does not detect the presence of a charger. Since redundant BFCs 220A, 220B, 220C are provided, the need for redundant reverse blocking devices 215 is avoided. In general, the BFCs 220A, 220B, 220C have reduced cost and footprint compared to redundant reverse blocking devices 215 if they were provided.

In some embodiments, the outputs of the BFCs 220A, 220B, 220C are provided as alternative activation inputs to the ACL devices 210A, 210B, 210C such that the isolation devices 210A1, 210B1, 210C1 are opened to isolate the battery 240 from the L− terminal if the BFCs 220A, 220B, 220C detect current through the reverse blocking device 215 or if the ACL devices 210A, 210B, 210C detects an overcurrent situation. In this manner, the isolation devices 210A1, 210B1, 210C1 are shared by the BFCs 220A, 220B, 220C and the ACL devices 210A, 210B, 210C.

When the isolation devices 210A1, 210B1, 210C1 are activated, the current formerly flowing through the isolation devices 210A1, 210B1, 210C1 flows through the bypass circuit 225. In general, the bypass circuit 225 provides a path with increased resistance as compared to the path through the isolation devices 210A1, 210B1, 210C1, thereby limiting the current when the isolation devices 210A1, 210B1, 210C1 are opened by the BFCs 220A, 220B, 220C or the ACL devices 210A, 210B, 210C.

The bypass circuit 225 includes one or more resistors, for example, resistors 225A1, 225A2, 225A3. In some embodiments, the bypass circuit 225 includes a fuse 225B that is sized to limit the current to about ⅔ of the current rating of the resistors 225A. In some embodiments, the bypass circuit 225 includes a protection circuit 225C and associated isolation device 225D that measures current through the resistors 225A1, 225A2, 225A3 and opens the isolation device 225D responsive to the current through the resistors 225A1, 225A2, 225A3 reaching a limit approaching that of the fuse 225B to avoid blowing the fuse 225B, which is unrecoverable. For purposes of safety standards, the resistors 225A1, 225A2, 225A3 and the fuse 225B are tested to confirm conformance to spark and thermal requirements.

In some embodiments, the bypass circuit 225 is also employed when the load is inactive to reduce the discharge rate of the battery 240 arising from active protection circuitry, for example, the ACL devices 210A, 210B, 210C. The bypass control module 230 controls a transistor 230A that enables power to the ACL devices 210A, 210B, 210C. In some embodiments, the bypass control module 230 turns off the power to the ACL devices 210A, 210B, 210C via the transistor 230A responsive to the LD signal indicating that the load (e.g., radio) is either off or disconnected. In this manner, the leakage current of the battery 240 is reduced by approximately 95%, extending the storage life of the battery module 100A, 100B in the inactive state from about three months to longer than 12 months. The bypass control module 230 turns on the power to the ACL devices 210A, 210B, 210C via the transistor 230A responsive to the LD signal indicating that the load is on or responsive to enable active current limit detection if the load is active. When the load is first activated, it generally has low start up current requirements. The high resistance path created by the resistors 225A1, 225A2, 225A3 limits the inrush current during startup of the load.

In some embodiments, the bypass control module 230 also controls power to the ACL devices 210A, 210B, 210C responsive to the Cm signal indicating the presence or absence of a charger. The bypass control module 230 enables the transistor 230A responsive to the charger being active to enable the ACL devices 210A, 210B, 210C.

In some embodiments, the bypass control module 230 also controls the transistor 230A based on the DoA or DoB signal from the protection units 205A, 205B. If either DoA or DoB is asserted (e.g., logic "0") to indicate a discharge interruption, the bypass control module 230 opens the transistor 230A to remove power from the ACL devices 210A, 210B, 210C. When power is removed, the isolation devices 210A1, 210B1, 210B1 open. In this manner, the bypass control module 230 provides redundant discharge protection, reducing or obviating the need for an isolation device on the DoB terminal of the protection unit 205B.

In an embodiment including all of these variations, where the bypass control module controls based on $L_D$, $C_{TH}$, DoA, and DoB, the logic equation employed by the bypass control module 230 is:

Turn On=($L_D$//$C_{TH}$)&&DoA,&&DoB (where "//" indicates a logical "OR" and && indicates a logical "AND").

In some embodiments, the charger terminal CH− has an alternate connection location indicated by dashed optional connection line 265 and optional connection break 270. In this arrangement, the CH− terminal is connected to the input of the bypass circuit 225 in series with the isolation devices 210A1, 210B1, 210C1

The overvoltage protectors 235A, 235B and associated isolation devices 235A1, 235B1 provide front-end overvoltage protection for the charger contact CH+. If the $C_{TH}$ signal is at a logic "0" indicating the absence of a charger or if the CoA or CoB signals are at a logic "0" indicating an overvoltage condition, the overvoltage protectors 235A, 235B open the isolation devices 235A1, 235B1.

Figure 3:
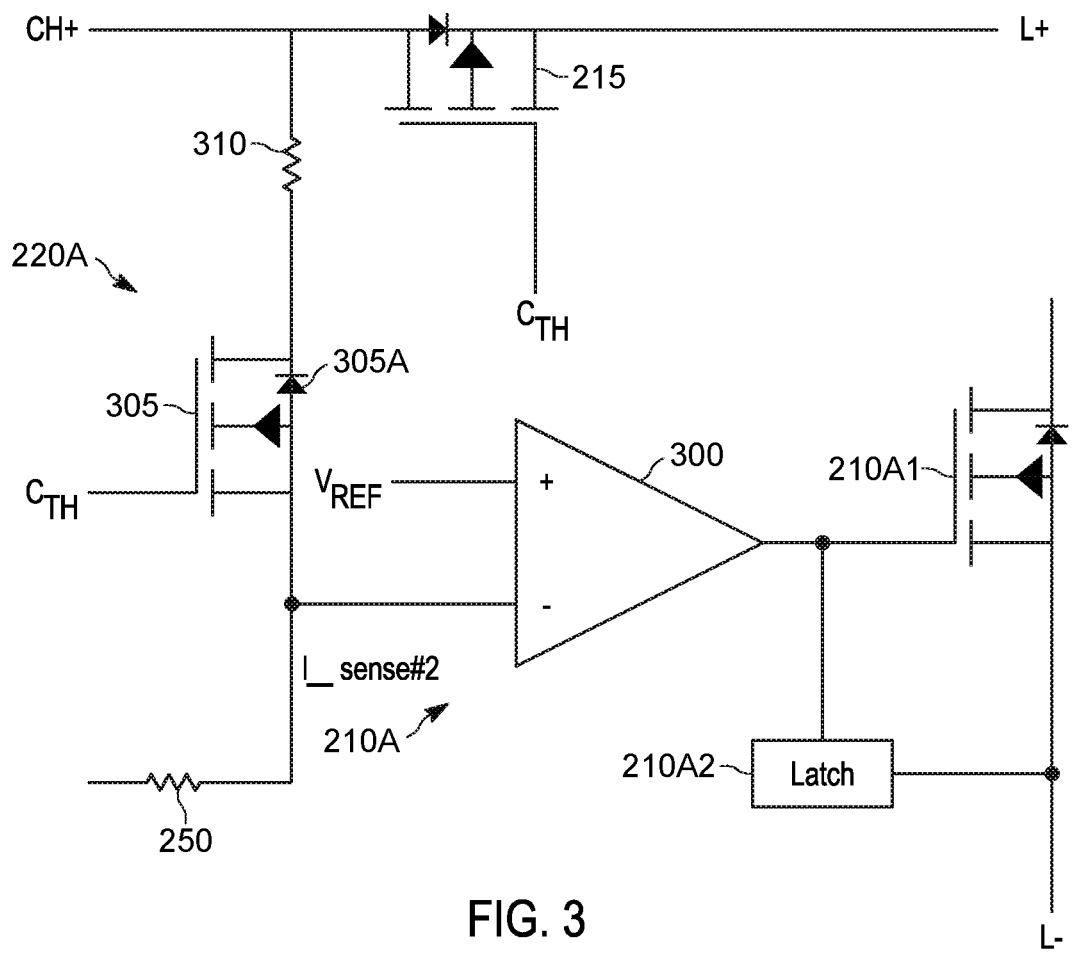
FIG. 3 is a simplified circuit diagram of an active current limit circuit and a backflow detection circuit in the battery protection circuit of FIGS. 2A and 2B, according to some embodiments.

FIG. 3 is a simplified circuit diagram illustrating the ACL device 210A and the BFC 220A in the battery protection circuit 200 of FIGS. 2A and 2B, according to some embodiments. The other redundant ACL and BFC circuits have similar structure, so they are not separately illustrated. In some embodiments, the ACL device 210A is implemented using a comparator 300 having a reference voltage, VREF, at one input terminal and the voltage representing the current measurement by the signal I-sense#2 generated by the current sense resistor 250 at the other input terminal. When current flowing through the current sense resistor 250 causes a voltage across the current sense resistor 250 to exceed that of VREF, the output of the comparator 300 changes state. In some embodiments, the isolation device 210A1 is an N-type device, and the output of the comparator 300 transitions from a logic "0" to a logic "1" causing the isolation device 210A1 to enter a high impedance state, thereby blocking current In some embodiments, the BFC 220A is implemented by a transistor 305 having a resistor 310 coupled to a first terminal. A second terminal of the transistor 305 is coupled to the input of the comparator 300 in parallel with the output of the current sense resistor 250. A gate terminal of the transistor 305 is coupled to the $C_{TH}$ terminal. The transistor 305 includes a body diode 305A. The forward voltage of the body diode 305A is employed to detect a failure of the reverse blocking device 215. The transistor 305 is enabled by the Cm signal. The current flowing through the body diode 305A generates a voltage at the negative terminal of the comparator 300 that serves as an alternative activation signal. For example, if the CH+ and CH− terminals are shorted, for example, from dust or other materials in the environment, the body diode 305A provides sufficient voltage drop to cause the comparator 300 to change its output state. Sharing the comparator 300 for implementing the ACL device 210A and the BFC 220A reduces cost and footprint of the battery protection circuit 200.

Figure 4:
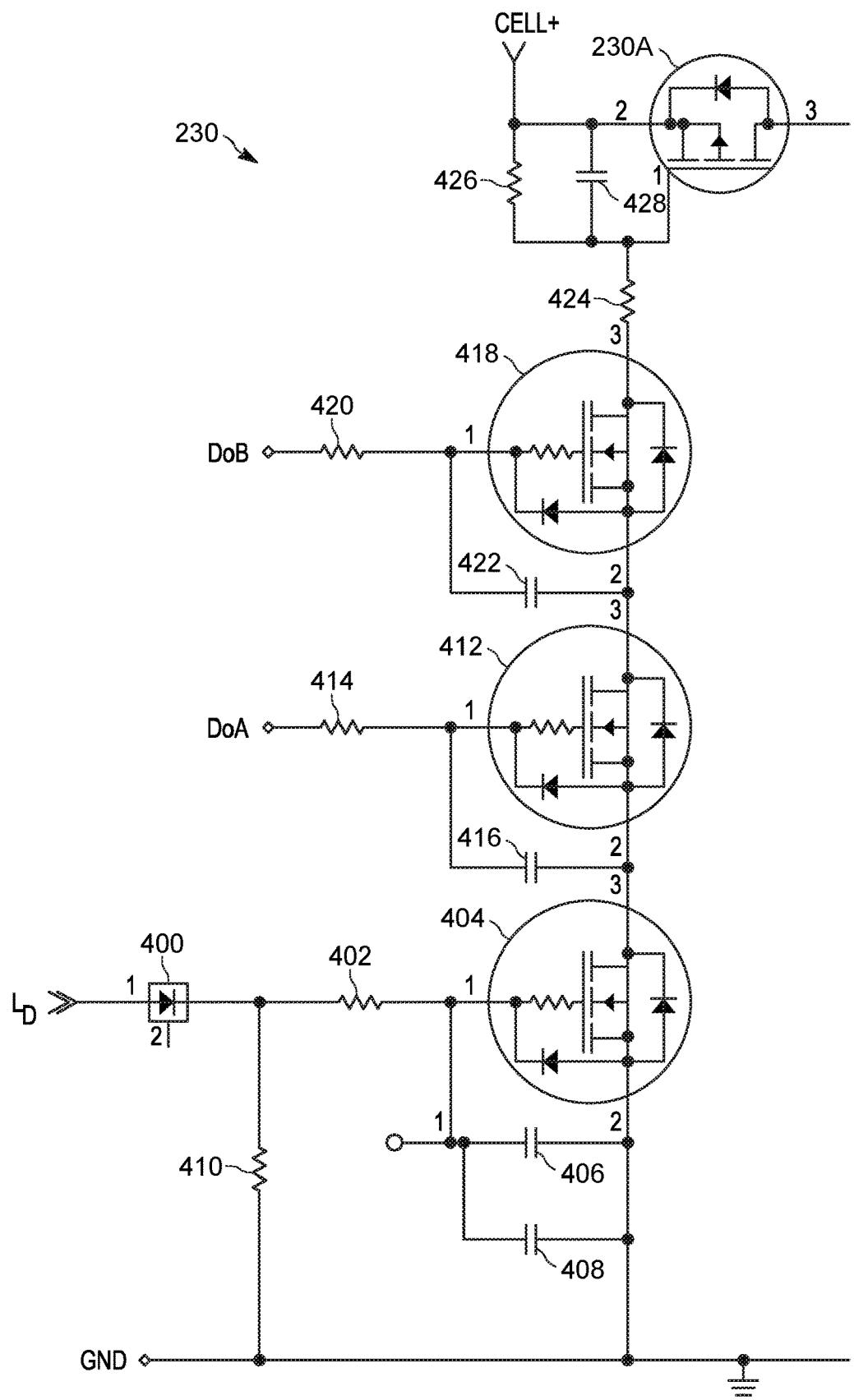
FIG. 4 is a circuit diagram of a bypass control circuit in the battery protection circuit of FIGS. 2A and 2B, according to some embodiments.

FIG. 4 is a circuit diagram illustrating an example bypass control circuit 230, according to some embodiments. The bypass control circuit 230 of FIG. 4 controls power to ACL devices 210A, 210B, 210C based on the $L_D$, DoA, and DoB signals. The $L_D$ signal is rectified by a diode 400. A resistor 402 is coupled between the diode 400 and the gate terminal of an isolation device 404. Parallel capacitors 406, 408 are coupled between the resistor 402 and a grounded terminal of the isolation device 404. A resistor 410 is coupled between the diode 400 and ground. The resistors 402, 410 and capacitors 406, 408 define the time constant for the rectified $L_D$ signal The DoA signal is provided to the gate terminal of an isolation device 412 through a resistor 414. A capacitor 416 is coupled between the resistor 414 and a terminal of the isolation device 412 coupled to the isolation device 404. The capacitor 416 charges through the resistor 414 to enable the isolation device 412 when the DoA is in a logic "1" state.

The DoB signal is provided to the gate terminal of an isolation device 418 through a resistor 420. A capacitor 422 is coupled between the resistor 420 and a terminal of the isolation device 418 coupled to the isolation device 412. The capacitor 422 charges through the resistor 420 to enable the isolation device 418 when the DoB is in a logic "1" state.

A pull-up resistor 424 is coupled between the isolation device 418 and a gate terminal of the isolation device 230A (see FIGS. 2A and 2B). A resistor 426 and a capacitor 428 are coupled in parallel between the Cell+ voltage and the resistor 424 to generate a voltage at the gate terminal of the isolation device 230A. Thus, the isolation device 230A is enabled to power the ACL devices 210A, 210B, 210C when the LD signal is present and the DoA, and DoB signals are at a logic "1" state.

In some embodiments, the bypass control circuit 230 may be modified to include parallel activation based on the $C_{TH}$ signal by providing another isolation device in parallel with the isolation device 404 having a gate terminal receiving the $C_{TH}$ signal. A similar rectifying and time constant circuit may be provided on the $C_{TH}$ terminal.

In the foregoing specification, specific embodiments have been described. However, one of ordinary skill in the art appreciates that various modifications and changes may be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms for example, first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") for example, microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it may be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A battery module, comprising:
   a first load terminal (L+);
   a second load terminal (L−);
   a first charger terminal (CH+);
   a charger enable terminal (CTH);
   a battery (240) having a first battery terminal (Cell+) coupled to the first load terminal (L+) and a second battery terminal (Cell−) coupled to the second load terminal (L−);
   a first isolation device (215) coupled between the first load terminal (L+) and the first charger terminal (CH+) and having an enable terminal coupled to the charger enable terminal (CTH); and
   a first protection circuit, comprising:
      a second isolation device (210A1) coupled between the second battery terminal (Cell−) and the second load terminal (L−); and
      a first sensing circuit (210A) configured to enable the second isolation device (210A1) responsive to detecting a failure of the first isolation device (215),
   wherein the first sensing circuit (210A) comprises:
      a first comparator (300) having a first input terminal coupled to a reference voltage terminal and a first output terminal coupled to an enable terminal of the second isolation device (210A1); and
      a first transistor (305) having a first terminal coupled to the first charger terminal (CH+), a second terminal coupled to a second input terminal of the first comparator (300), and the enable terminal coupled to the charger enable terminal (CTH).

2. The battery module of claim 1, further comprising:
   a resistor (310) coupled between the first terminal of the first transistor (305) and the first charger terminal (CH+).

3. The battery module of claim 1, wherein the first sensing circuit (210A) is configured to measure a battery parameter and control the second isolation device (210A1) based on the battery parameter.

4. The battery module of claim 1, wherein the first sensing circuit (210A) comprises:
a current sense resistor (250) coupled between the second battery terminal (Cell−) and the second load terminal (L−),
wherein the second input terminal of the first comparator (300) is coupled to the current sense resistor (250).

5. The battery module of claim 4, wherein the first protection circuit comprises:
a third isolation device (210B1) coupled between the second battery terminal (Cell−) of the battery (240) and the second load terminal (L−);
a second comparator having a first input terminal coupled to the reference voltage terminal, a second input terminal coupled to the current sense resistor (250), and a first output terminal coupled to an enable terminal of the third isolation device (210B1); and
a second transistor having a first terminal coupled to the first charger terminal (CH+), a second terminal coupled to the second input terminal of the second comparator, and a second enable terminal coupled to the charger enable terminal (CTH).

6. The battery module of claim 4, further comprising:
a second charger terminal (CH−) coupled to the second load terminal (L−).

7. The battery module of claim 4, further comprising:
a driver circuit (230, 230A) coupled between the first battery terminal (Cell+) and the first protection circuit, the driver circuit (230, 230A) configured to control power to the first protection circuit based on a load enable signal asserted at a load enable terminal (LD); and
a bypass circuit (225) coupled between the second battery terminal (Cell−) and the second load terminal (L−).

8. The battery module of claim 7, further comprising:
a second charger terminal (CH−) coupled to the second battery terminal (Cell−).

9. The battery module of claim 7, wherein the bypass circuit (225) comprises:
a resistor (225A1, 225A2, 225A3); and
an isolation device coupled to the resistor (225A1, 225A2, 225A3).

10. The battery module of claim 7, wherein the isolation device of the bypass circuit (225) comprises a fuse (225B).

11. The battery module of claim 7, wherein the isolation device of the bypass circuit (225) comprises:
a second transistor (225D); and
a second protection circuit (225C) coupled to the second transistor (225D) and configured to control the second transistor (225D) based on a current flowing through the bypass circuit (225).

12. The battery module of claim 7, wherein the driver circuit (230, 230A) is configured enable power to the first protection circuit based on the load enable signal (LD) indicating activation of a load coupled to the first load terminal (L+) and the second load terminal (L−) or a charger enable signal asserted at the charger enable terminal (CTH) indicating connection of a charger to the first charger terminal (CH+) and the second charger terminal (CH−).

13. The battery module of claim 1, further comprising:
a third isolation device (235A1) coupled between the first charger terminal (CH+) and the first load terminal (L+); and
a second protection circuit (235A) coupled to the battery (240) and configured to control the third isolation device (235A1) based on a voltage of the battery (240).

14. The battery module of claim 1, further comprising:
a blocking failure circuit (220A) configured to block discharging of the battery (240) through the first charger terminal (CH+).

15. The battery module of claim 14, wherein the blocking failure circuit (220A) includes a first block terminal (BF#1) coupled to an input of the first sensing circuit (210A), and wherein the first sensing circuit (210A) is configured to enable the second isolation device (210A1) responsive to the blocking failure circuit (220A) detecting a discharge current of the battery (240) through the first charger terminal (CH+).

16. A method for protecting a battery module, comprising:
controlling a first isolation device (215) to isolate a first charger terminal (CH+) of the battery module from a first load terminal (L+) of the battery module responsive to a charger enable signal at a charger enable terminal (CTH) of the battery module indicating an absence of a charger coupled to the first charger terminal (CH+), wherein the first load terminal (L+) is coupled to a first battery terminal (Cell+) of a battery (240) in the battery module;
detecting a first current flowing between the first load terminal (L+) and the first charger terminal (CH+) while the first isolation device (215) is controlled to isolate the first charger terminal (CH+) from the first load terminal (L+);
controlling a second isolation device (210A1) to isolate a second battery terminal (Cell−) of the battery (240) from a second load terminal (L−) of the battery module responsive to detecting the first current, the first current indicating a failure of the first isolation device (215);
measuring a second current flowing through the battery (240);
controlling the second isolation device (210A1) using a first protection circuit (210A) to isolate the second battery terminal (Cell−) from the second load terminal (L−) responsive to the second current exceeding a threshold;
providing a bypass circuit (225) coupled between the battery (240) and the first load terminal (L−) in parallel with the second isolation device (210A1); and
enabling power to the first protection circuit (210A) based on a load enable signal at a load enable terminal (LD) of the battery module indicating activation of a load coupled to the battery (240).

17. The method of claim 16, wherein the bypass circuit (225) comprises a resistor (225A1, 225A2, 225A3) and a third isolation device (225D) coupled to the resistor (225A1, 225A2, 225A3), the method further comprising:
controlling the third isolation device (225D) based on a current flowing through the bypass circuit (225).

18. The method of claim 16, further comprising:
controlling a third isolation device (235A1) coupled between the first charger terminal (CH+) of the battery module and the first load terminal (L+) based on a voltage of the battery (240).

* * * * *